(12) United States Patent
Krauss et al.

(10) Patent No.: US 8,410,969 B2
(45) Date of Patent: Apr. 2, 2013

(54) WIDE RANGE CHARGE BALANCING CAPACITIVE-TO-DIGITAL CONVERTER

(75) Inventors: Mathias Krauss, Dresden (DE); Maha Jaafar, Madison, WI (US); Ke Wang, Madison, WI (US); Eric Hoffman, Middleton, WI (US)

(73) Assignee: Zentrun Mikroelektronic Dresden AG, Dresden (DE)

(*) Notice: Subject to any disclaimer, the term of this patent is extended or adjusted under 35 U.S.C. 154(b) by 42 days.

(21) Appl. No.: 13/144,046

(22) PCT Filed: Jan. 12, 2010

(86) PCT No.: PCT/US2010/020741
§ 371 (c)(1),
(2), (4) Date: Sep. 26, 2011

(87) PCT Pub. No.: WO2010/081136
PCT Pub. Date: Jul. 15, 2010

(65) Prior Publication Data
US 2012/0112947 A1    May 10, 2012

Related U.S. Application Data

(60) Provisional application No. 61/143,851, filed on Jan. 12, 2009.

(51) Int. Cl.
*H03M 1/12* (2006.01)

(52) U.S. Cl. ............... 341/172; 341/143; 341/155

(58) Field of Classification Search .......... 341/143, 341/172
See application file for complete search history.

(56) References Cited

U.S. PATENT DOCUMENTS 5,659,314 A * 8/1997 Tokura et al. ............. 341/143
5,661,240 A * 8/1997 Kemp ....................... 73/514.32

(Continued)

FOREIGN PATENT DOCUMENTS

DE    102005038875 A1    11/2006
DE    102007025947 A1    12/2008

(Continued)

OTHER PUBLICATIONS

Cichocki A et al: "Switched-Capacitor Transducers With Digital or Duty-Cycle Output Based on Pulse-Width Modulation Technique," International Journal of Electronics, Taylor and Francis. Ltd., London, GB, vol. 71, No. 2, Aug. 1, 1991, pp. 265-278.

International Search Report dated Apr. 29, 2010 for PCT/US2010/020741.

*Primary Examiner* — Khai M Nguyen
(74) *Attorney, Agent, or Firm* — Kevin P. Radigan, Esq.; Heslin Rothenbeg Farley & Mesiti P.C.

(57) ABSTRACT

A capacitive-to-digital converter is provided which includes: sensor, offset and reference capacitors, an integrator circuit and a demodulation circuit. The sensor capacitor is switched according to a first clock and the offset capacitor according to a second clock, which has a higher switching frequency. The reference capacitor is switched according to a return signal from the converter's output. The integrator circuit includes an integrator capacitor, and has first and second nodes, with the sensor, offset and reference capacitors each being switched to the first and second nodes based on the respective first clock, second clock or return signal. The demodulation circuit receives and converts output of the integrator circuit into a digital output. The higher frequency clocking of the offset capacitor allows for a reduction in capacitance of the offset, reference or integrator capacitor, and the multiclocking of the converter allows for use of a multireferencing to the sensor capacitor.

9 Claims, 3 Drawing Sheets

U.S. PATENT DOCUMENTS

| | | | |
|---|---|---|---|
| 5,990,578 A * | 11/1999 | Krauss | 307/116 |
| 6,140,952 A | 10/2000 | Gaboury | |
| 6,452,521 B1 | 9/2002 | Wang et al. | |
| 6,473,018 B2 * | 10/2002 | Ueno et al. | 341/143 |
| 6,970,126 B1 | 11/2005 | O'Dowd et al. | |
| 7,561,086 B2 * | 7/2009 | Nys | 341/143 |
| 8,045,089 B2 * | 10/2011 | Kim | 349/58 |
| 2007/0171108 A1 | 7/2007 | Wang | |

FOREIGN PATENT DOCUMENTS

| | | |
|---|---|---|
| JP | 60041327 A | 3/1985 |
| WO | 20040090852 A1 | 10/2004 |

* cited by examiner

WIDE RANGE CHARGE BALANCING CAPACITIVE-TO-DIGITAL CONVERTER

CROSS-REFERENCE TO RELATED APPLICATION

This application is a national stage filing under section 371 of International Application No. PCT/US2010/020741 filed on Jan. 12, 2010, and published in English on Jul. 15, 2010 as WO 2010/081136 and claims the benefit of U.S. Provisional Application No. 61/143,851, filed Jan. 12, 2009, the entire disclosure of these applications being hereby incorporated herein by reference in their entirety.

BACKGROUND

The present invention relates in general to a wide range capacitive-to-digital charge balancing converter based on complementary metal-oxide-semiconductor (CMOS) devices for accurate capacitance-to-digital conversion of a capacitive sensor signal.

Capacitive sensor signal-conditioning integrated circuits, such as the cLite™ capacitive sensor signal conditioner (or cLite™ ASSP (Application Specific Standard Product)) available from Zentrum Mikroelektronik Dresden (ZMD) AG of Dresden Germany, comprise a capacitive-to-digital converter and are able to convert a capacitance within a selectable range (for example, 2-260 pF in the case of the cLite™ signal conditioner) to a corresponding digital value. Advantageously, the cLite™ signal conditioner currently provides a 14-bit resolution and very high accuracy over wide ranges of capacitances and temperatures, and can be used as input for microcontrollers or other switch applications.

Capacitive sensors are widely used in many MEMS sensing elements, such as pressure sensors for hydraulic control systems, humidity sensors and liquid level gauges. Such sensors do not touch or make direct contact with the system or device being sensed, and thus the sensors are advantageous for industrial linear and angular position sensors and contactless potentiometers, even under harsh or explosive environmental conditions.

For a capacitive-to-digital converter (CDC) covering a wide range, such as the cLite™ capacitive sensor and signal conditioner noted above, on-chip offset, reference and integrator capacitors must conventionally collectively be as large as or larger than the sensor capacitor. This can be impractical and costly depending on the desired implementation.

BRIEF SUMMARY

In one aspect, the shortcomings of the prior art are overcome and additional advantages are provided through the provision of a charge balancing capacitive-to-digital converter comprising a sensor capacitor, an offset capacitor, a reference capacitor, an integrator circuit, and a demodulation circuit. The sensor capacitor is switched according to a first clock signal of a first clock schedule, and the offset capacitor is switched according to a second clock signal of a second clock schedule, wherein the second clock schedule is of higher frequency than the first clock schedule. The reference capacitor is provided for charge balancing and is switched according to a return signal from an output of the charge balancing capacitive-to-digital converter. The integrated circuit comprises an integrator capacitor, and has a first input node and a second input node. The sensor capacitor, offset capacitor and reference capacitor are each switched to the first input node or the second input node based on the respective first clock schedule, second clock schedule or return signal. The demodulation circuit receives and converts output of the integrator circuit into a clocked digital output, wherein the second clock schedule being of higher frequency than the first clock schedule allows a reduction in capacitance of at least one of the offset capacitor, reference capacitor or integrator capacitor.

Advantageously, provided herein is a wide range capacitive-to-digital charge balancing converter with high resolution and low manufacturing cost. This is accomplished, in one embodiment, by employing both a multi-clocking and a multi-referencing approach.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION

Figure 1:
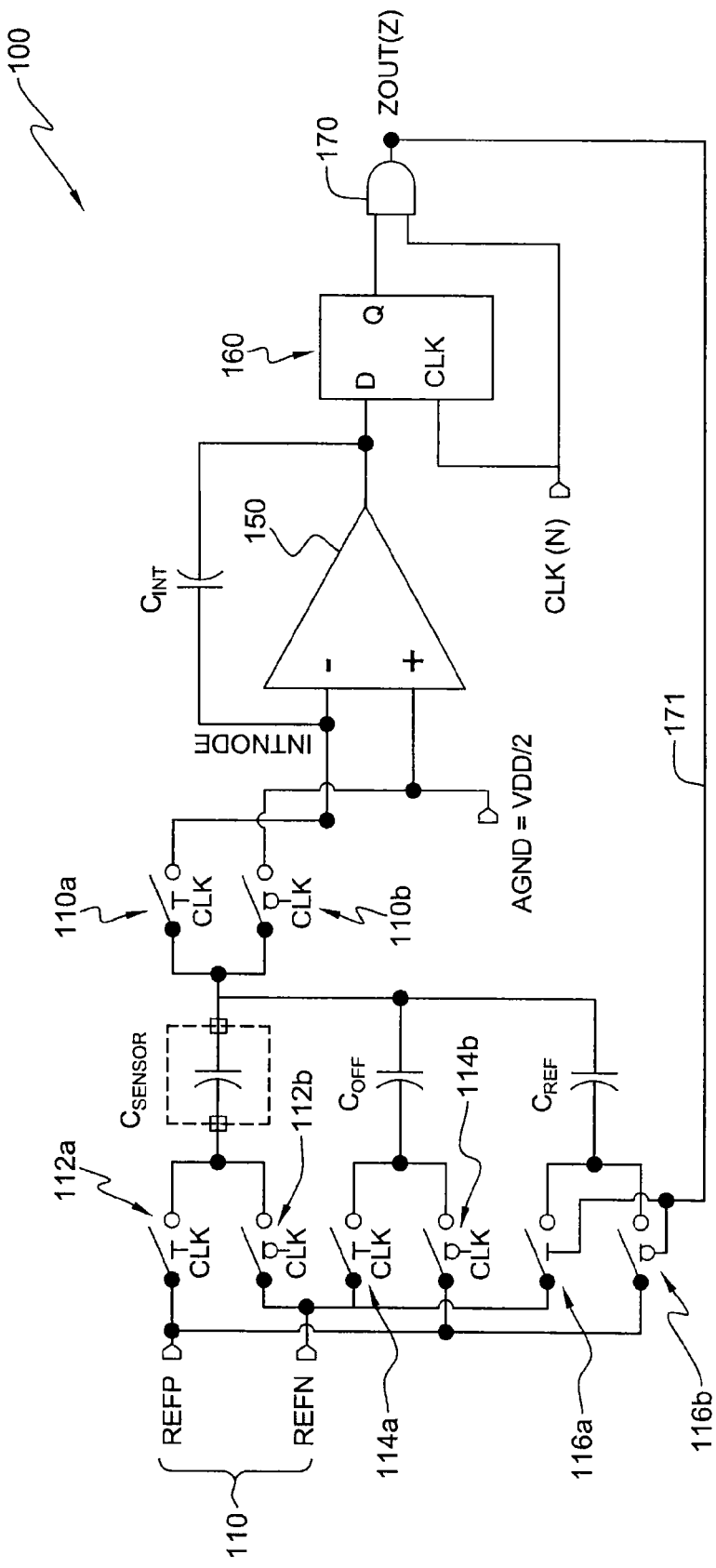
FIG. 1 depicts one embodiment of a charge balancing capacitive-to-digital (C/D) converter.

FIG. 1 shows an example of a charge balancing capacitive-to-digital converter 100. Converter 100 has as a main input $C_{SENSOR}$ whose output node is connected over a first switch 110a to the negative IntNode of an operational amplifier (or integrator) 150 and over a second switch 110b to the positive input of operational amplifier 150. As shown, the first switch is clocked with a clock signal CLK and the second switch with the inverted CLK. The output node of operational amplifier 150 is bridged with the IntNode thereof by an integrator capacitor $C_{INT}$ and is connected via a demodulator 160 to an input of an AND gate 170, which outputs a signal ZOUT (Z). The other input of AND gate 170, as well as the other input of demodulator 160, is connected to receive clock signal CLK (N).

The input of $C_{SENSOR}$ is connected to REFP over a first switch 112a, which is clocked by CLK, and to REFN over a second switch 112b, clocked by inverted CLK. The difference between REFP and REFN is the reference voltage 110. Capacitances $C_{OFF}$ and $C_{REF}$ are coupled in parallel with $C_{SENSOR}$. These capacitances are switched ON or OFF by respective switches 114a, 114b and 116a, 116b which are clocked by CLK and inverted CLK, in the case of $C_{OFF}$, and by a return signal 171 from the output ZOUT (Z) of converter 200, in the case of $C_{REF}$.

The operating principal is $$N*C_{SENSOR}*V_{REF} - N*C_{OFF}*V_{REF} - Z*C_{REF}*V_{REF} = 0$$

where $V_{REF}$=(REFP−REFN).

The capacitor $C_{SENSOR}$, which is the sensor capacitance, adds charge to IntNode every clock cycle CLK(N), while the capacitance $C_{OFF}$, which is the on-chip offset capacitance, subtracts charge from IntNode every clock cycle CLK (N).

$C_{REF}$ is the on-chip reference capacitance, and it subtracts charge from IntNode every clock cycle that it is enabled by ZOUT (Z).

ZOUT (Z) enables $C_{REF}$ when needed to balance the net charge, and the ratio of Z/N is:

$$Z/N = (C_{SENSOR} - C_{OFF})/C_{REF}$$

A charge balancing C/D converter such as depicted in FIG. 1 shows very low sensitivity to circuit components, but does have limitations.

These include:

$$(C_{SENSOR} - C_{OFF})/C_{REF} * (V_{REF}/2) < \quad\quad 1)$$
$$(VDD/2) \Rightarrow C_{SENSOR} \leq C_{REF} + C_{OFF} \text{ assuming } V_{REF} =$$
$$VDD \; C_{SENSOR} \leq C_{REF} \text{ assuming } C_{OFF} = 0$$

$$(C_{REF}/C_{INT}) * (V_{REF}/2) < (VDD/2) \Rightarrow C_{REF} < \quad\quad 2)$$
$$C_{INT} \text{(Design target } C_{INT} = 1.25 * C_{REF}) \text{ or } V_{REF} < VDD.$$

On-chip capacitors ($C_{OFF}$, $C_{REF}$, and $C_{INT}$) thus conventionally have to collectively be greater than or equal to $C_{SENSOR}$. This imposes a limitation on the size of $C_{SENSOR}$.

Figure 2:
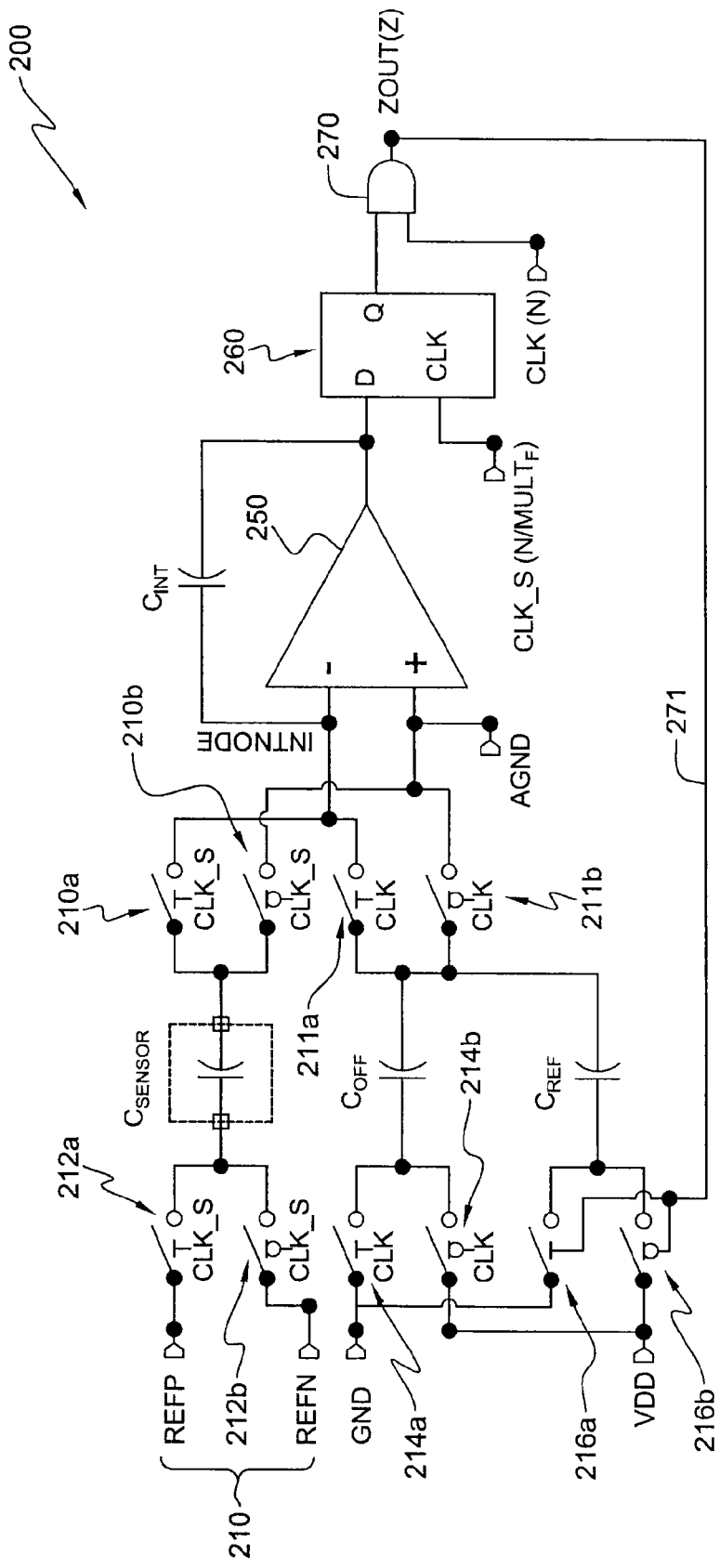
FIG. 2 depicts one embodiment of a charge balancing C/D converter with multi-clocking and multi-referencing characteristics, in accordance with an aspect of the present invention.

FIG. 2 illustrates an enhanced capacitive-to-digital charge balancing converter, generally denoted 200, in accordance with aspects of the present invention. Converter 200 advantageously employs multi-clocking and multi-referencing, as described below.

As illustrated in FIG. 2, capacitances $C_{SENSOR}$, $C_{OFF}$ and $C_{REF}$ are connected to the negative input (i.e. IntNode) of operational amplifier (or integrator) 250, or alternatively, to the positive input of operational amplifier 250 via separate switches 210a, 210b, 211a, 211b.

Specifically, switch 210a connects/disconnects the output signal of capacitance $C_{SENSOR}$ with IntNode, and is clocked by a first clocking signal Clk_S, while switch 210b connects/disconnects the output signal of capacitance $C_{SENSOR}$ with the positive input of operational amplifier 250, and is clocked by the inverted first clocking signal Clk_S.

The offset and reference capacitances ($C_{OFF}$ and $C_{REF}$) are coupled via switches 211a, 211b alternatively to the negative input IntNode or the positive input of operational amplifier 250 using a second clocking signal CLK, and inverted second clocking signal CLK, as shown.

The input of $C_{SENSOR}$ is connected with REFP over a first switch 212a, which is clocked by first clocking signal CLK_S, and with REFN over a second switch 212b, which is clocked by an inverted CLK_S. Thus, reference voltage 210 (VREF) equals REFP−REFN.

The inputs of $C_{OFF}$ and $C_{REF}$ are connected/disconnect alternatively to ground (GND) or VDD so that the voltage over the capacitances $C_{OFF}$ and $C_{REF}$ alternates from GND to VDD depending on the setting of the switches 214a, 214b, 216a, 216b on the input side. Switches 214a, 214b on the input side of $C_{OFF}$ are clocked with the second clocking signal CLK and inverted CLK, respectively, while switches 216a, 216b on the input side of $C_{REF}$ are clocked with return signal 271 from the output (ZOUT (Z)) of converter 200.

As shown, the output node of operational amplifier 250 is bridged with the IntNode thereof via an integrator capacitor $C_{INT}$ and is connected via a demodulator 260 with an input of an AND gate 270, which outputs signal ZOUT (Z). The other input of AND gate 270 is connected to receive second clock signal CLK (N), while the clock input to demodulator 260 receives first clock signal CLK_S (N/MULT$_F$). Multclocking is accomplished by configuring the first clocking schedule of the first clocking signal to be a factor (MULT$_F$) lower than the second clocking schedule of the second clocking signal. The second clocking schedule for clocking signal CLK can be written as CLK (N), where N is the number of clocks per unit of time. Thus, the first clocking schedule for clocking signal CLK_S can be written as CLK_S (N/MULT$_F$), where N/MULT$_F$ is the number clocks of CLK_S, per same unit of time.

Figure 4:
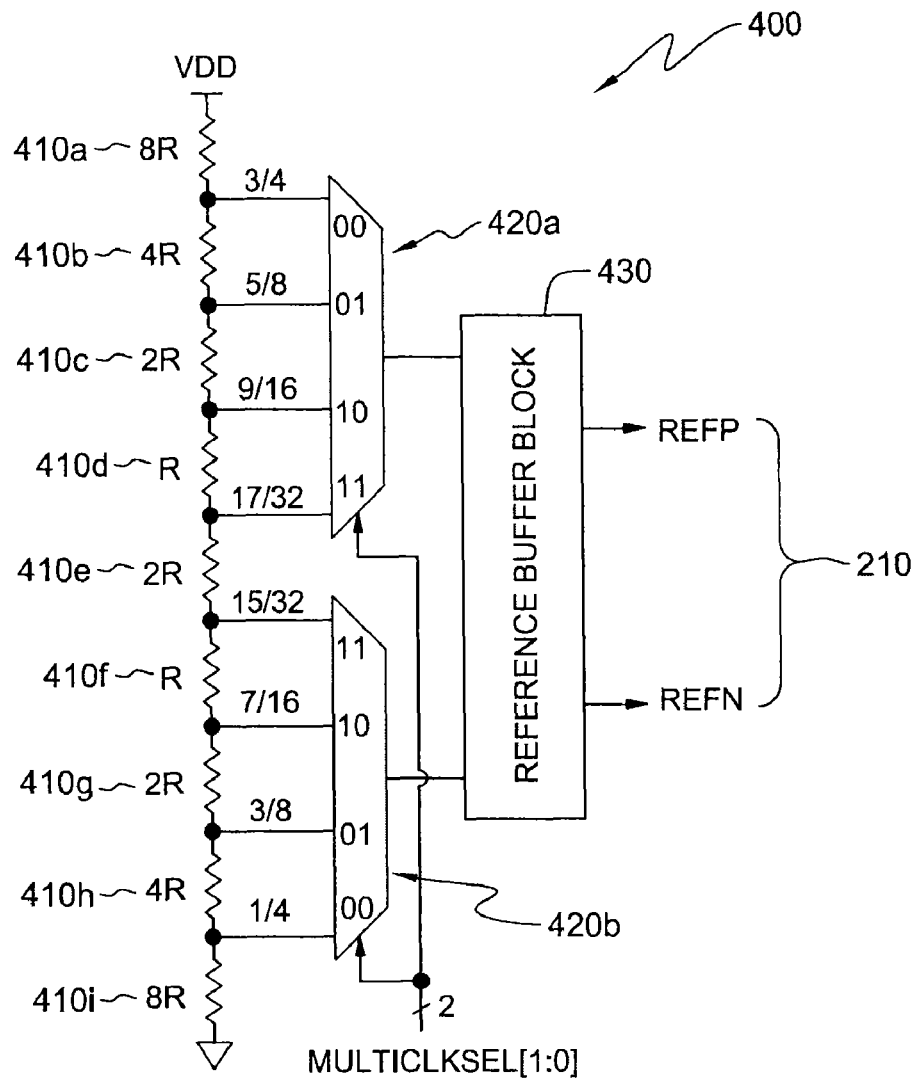
FIG. 4 depicts one embodiment of a reference input voltage selector circuit for selecting an input reference voltage level (REFP–REFN) for input to the sensor capacitor of the charge balancing C/D converter of FIG. 2, in accordance with one or more aspects of the present invention.

FIG. 2 shows an example in which the second to first clock signals (CLK, CLK_S) are in a 2:1 mode, but (by way of example) clocking in a 1:1, 4:1 or 8:1 mode is also possible. Details of these modes are shown in FIG. 4, which is described further below.

Innovations in the converter 200 circuitry of FIG. 2 include:

$$(N/mult_F)*C_{SENSOR}*V_{REF} - N*C_{OFF}*VDD - Z*C_{REF}*VDD = 0$$

$$N*C_{SENSOR} - N*C_{OFF}*mult_F*(VDD/V_{REF}) - Z*C_{REF}*mult_F*(VDD/V_{REF}) = 0$$

$$Z/N = (C_{SENSOR} - (C_{OFF}+mult_F+mult_V))/(C_{REF}+mult_F+mult_V)$$

Wherein:
1) $C_{OFF}$ and $C_{REF}$ are on-chip trim-able capacitors of 0 pF to 7 pF (e.g., 3-bit trim of 1 pF steps).
2) mult$_F$: Multi-clocking modes of $C_{REF}$ and $C_{OFF}$ to support the range of $C_{SENSOR}$ sizes (256 PF) without large on chip $C_{REF}$ & $C_{OFF}$ capacitors.

For example:
  1:1 (CLK:CLK_S) clocking mode when $C_{SENSOR} \in$ (2 pF, 16 pF)
  2:1 clocking mode when $C_{SENSOR} \in$ (16 pF, 64 pF)
  4:1 clocking mode when $C_{SENSOR} \in$ (64 pF, 256 pF)
3) mult$_V$: variable ($V_{REFP} - V_{REFN}$) reference levels to support large $C_{SENSOR}$ sizes (256 pF), without a large on-chip $C_{INT}$ capacitor.

By way of specific examples:
  [REFP, REFN]=[¾, ¼] when in 1:1 clocking mode ($C_{SENSOR} \in$ (2 pF, 16 pF)), $C_{INT}$=20 pF
  [REFP, REFN]=[⅝, ⅜] when in 2:1 clocking mode ($C_{SENSOR} \in$ (16 pF, 64 pF)), $C_{INT}$=40 pF
  [REFP, REFN]=[%16, 7⁄16] when in 4:1 clocking mode ($C_{SENSOR} \in$ (64 pF, 256 pF)), $C_{INT}$=80 pF.

Figure 3:
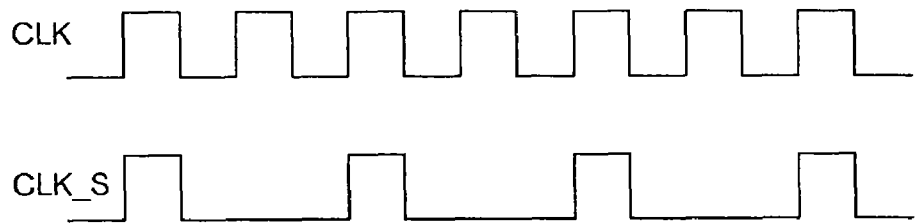
FIG. 3 is a clock timing diagram illustrating one example of a first clock signal (CLK_S) and a second clock signal (CLK) employed in the change balancing C/D converter circuit of FIG. 2, specifically illustrating 2:1 clocking mode (i.e., [CLK:CLK_S]), in accordance with one or more aspects of the present invention.

FIG. 3 illustrates an example of 2:1 (CLK:CLK_S) clocking mode, where $C_{REF}$ and $C_{OFF}$ (shown in FIG. 2) each receives two clock pulses to transfer enough charge to balance the charge added by a single clocking of $C_{SENSOR}$. In order to keep $C_{INT}$ reasonably small, the reference voltage (REFP−REFN) to $C_{SENSOR}$ is reduced (e.g., [REFP-REFN]=⅝ VDD−⅜ VDD).

In FIG. 4 a reference input voltage selector 400 is shown receiving a multi-clocking select signal (MULTICLKSEL[1:0]), and providing a VREF 210 (REFP−REFN) to the charge balancing C/D converter of FIG. 2. This clocking device would be connected to the respective inputs REFP and REFN of converter shown in FIG. 2. As depicted, reference input voltage selector 400 is clocked by clock signal MULTI-CKLSEL[1:0], which is determined (for example) by comparing the second clock schedule of the second clock signal CLK to the first clock schedule of the first clock signal CLK_S.

The reference voltage selector has two signal generators 420a, 420b, generating two output signals as input for a reference buffer block 430, which outputs REFP and REFN.

A shown, the inputs to the signal generators are connected to respective nodes of a voltage divider comprising series connected resistors 410a-410i, which generate the desired ratios.

Advantageously, REFP and REFN scale with the multi-clock selection in such a way that when higher clocking ratios are used, a smaller quantity (REFP−REFN) is used.

As the quantity (REFP−REFN) reduces, less charge is added/subtracted by $C_{SENSOR}$ & $C_{REF}$. This allows $C_{INT}$ to remain reasonable in size.

In the example of FIG. 4:
[REFP, REFN]=[¾, ¼] when using 1:1 (CLK: CLK_S) clocking,
[REFP, REFN]=[⅝, ⅜] when using 2:1 clocking,
[REFP, REFN]=[9/16, 7/16] when using 4:1 clocking, and
[REFP, REFN]=[17/32, 15/32] when using 8:1 clocking.

Note that $C_{INT}$ could be kept small by always using [REFP, REFN]=[17:32, 15/32], but by using such a small reference voltage when measuring small sensor capacitances (e.g., 2 pF) the noise floor would rise, which means kT/C noise, for instance, would rise.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

The invention claimed is:

1. A charge balancing capacitive-to-digital converter comprising:
 a sensor capacitor switched according to a first clock signal of a first clock schedule;
 an offset capacitor switched according to a second clock signal of a second clock schedule, the second clock schedule comprising a higher switching frequency than the first clock schedule;
 a reference capacitor for charge balancing, and switched according to a return signal from an output of the charge balancing capacitance-to-digital converter;
 an integrator circuit, the integrator circuit comprising an integrator capacitor, and comprising a first input node and a second input node, the sensor capacitor, offset capacitor, and reference capacitor each being switched to the first input node or the second input node based on the respective first clock schedule, second clock schedule or return signal; and
 a demodulation circuit receiving and converting output of the integrator circuit into a clocked digital output, wherein the second clock schedule being of higher switching frequency than the first clock schedule allows a reduction in capacitance in at least one of the offset capacitor, reference capacitor, or integrator capacitor.

2. The charge balancing capacitive-to-digital converter of claim 1, wherein each of the offset capacitor and the reference capacitor comprise an on-chip trim-able capacitor of 0 pF to 7 pF capacitance value.

3. The charge balancing capacitive-to-digital converter of claim 1, wherein the second clock schedule is at least 2× the frequency of the first clock schedule.

4. The charge balancing capacitive-to-digital converter of claim 1, wherein the second clock schedule is 2× the first clock schedule when the sensor capacitor is in a range of 16 pF to 64 pF, and the second clock schedule is 4× the first clock schedule when the sensor capacitor is in a range of 64 pF to 256 pF.

5. The charge balancing capacitive-to-digital converter of claim 1, wherein the sensor capacitor receives a first reference input voltage and the offset capacitor and reference capacitor receive a second reference input voltage, the first reference input voltage being different from the second reference input voltage.

6. The charge balancing capacitive-to-digital converter of claim 5, wherein the first reference input voltage comprises a variable voltage level (REFP−REFN) selected based on the first clock schedule and the second clock schedule, and the second reference input voltage is switched between GND and VDD.

7. The charge balancing capacitive-to-digital converter of claim 6, further comprising a reference input voltage selector, the reference input voltage selector providing the first reference input voltage to the sensor capacitor, and receiving as input a multiclock selection signal, the multiclock selection signal corresponding to a ratio of the second clock schedule to the first clock schedule, and wherein the reference input voltage selector employs the multiclock selection signal in selecting the first input reference voltage level (REFP−REFN).

8. The charge balancing capacitive-to-digital converter of claim 7, wherein an increase in the multiclock selection signal causes a decrease in the first input reference voltage level (REFP−REFN) provided to the sensor capacitor.

9. The charge balancing capacitive-to-digital converter of claim 1, wherein the demodulation circuit comprises a demodulator switched according to the first clock signal, and an AND gate receiving at a first input output of the demodulator and at a second input the second clock signal.

* * * * *

UNITED STATES PATENT AND TRADEMARK OFFICE
CERTIFICATE OF CORRECTION

PATENT NO.          : 8,410,969 B2
APPLICATION NO.     : 13/144046
DATED               : April 2, 2013
INVENTOR(S)         : Krauss et al.

Page 1 of 1

It is certified that error appears in the above-identified patent and that said Letters Patent is hereby corrected as shown below:

On the Title Page, Item [73]

In the Assignee (73): Delete "Zentrun" and insert --Zentrum--

Signed and Sealed this
Sixteenth Day of July, 2013

Teresa Stanek Rea
*Acting Director of the United States Patent and Trademark Office*